(12) United States Patent
Katrak

(10) Patent No.: US 11,018,513 B2
(45) Date of Patent: May 25, 2021

(54) BATTERY CELL MANAGEMENT SYSTEM

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 307 days.

(21) Appl. No.: 16/028,092

(22) Filed: Jul. 5, 2018

(65) Prior Publication Data

US 2019/0036357 A1 Jan. 31, 2019

Related U.S. Application Data

(60) Provisional application No. 62/539,322, filed on Jul. 31, 2017.

(51) Int. Cl.
*H02J 7/00* (2006.01)
*H01M 10/48* (2006.01)
(Continued)

(52) U.S. Cl.
CPC .......... *H02J 7/0021* (2013.01); *G01R 31/396* (2019.01); *H01M 10/425* (2013.01);
(Continued)

(58) Field of Classification Search
CPC .. H02J 7/0021; H02J 7/0026; H02J 7/000308; H01M 10/425; H01M 10/48; H01M 10/441; G01R 31/36; G01R 31/3648; G01R 31/3644; G01R 31/367; G01R 31/3835; G01R 31/396
See application file for complete search history.

(56) References Cited

U.S. PATENT DOCUMENTS

| | | | | |
|---|---|---|---|---|
| 5,581,170 A * | 12/1996 | Mammano | ............ | H02J 7/0019 320/116 |
| 5,705,914 A * | 1/1998 | Morita | .................. | B60L 3/0023 340/636.17 |
| 2009/0009143 A1* | 1/2009 | Odaohhara | ........... | H02J 7/0014 320/162 |
| 2014/0009165 A1* | 1/2014 | Miyazaki | ........... | G01R 31/3835 324/434 |

(Continued)

OTHER PUBLICATIONS

U.S. Appl. No. 16/013,130, filed Jun. 20, 2018 entitled Battery Cell Management System That Detects Data Misalignment Between Battery Cell Voltage Values and Battery Cell Overvoltage Flags.

(Continued)

*Primary Examiner* — David V Henze-Gongola
*Assistant Examiner* — Tarikh Kanem Rankine
(74) *Attorney, Agent, or Firm* — Buckert Patent & Trademark Law Firm PC; John F. Buckert

(57) ABSTRACT

A battery cell management system includes a microcontroller having first and second applications and first and second memory buffers. The first and second memory buffers have first and second overvoltage fault bits, respectively, associated with a first battery cell. The first application sets a first encoded overvoltage fault indicator equal to a first fault value if the first overvoltage fault bit of the first memory buffer is equal to a first binary value. The first application receives a second encoded overvoltage fault indicator from the second application. The first application commands a digital input-output device to generate control signals to transition a contactor to an open operational state if either the first encoded overvoltage fault indicator is equal to the first fault value or the second encoded overvoltage fault indicator is equal to a second fault value.

5 Claims, 15 Drawing Sheets

(51) Int. Cl.
| | |
|---|---|
| *H01M 10/46* | (2006.01) |
| *G01R 31/396* | (2019.01) |
| *H01M 10/44* | (2006.01) |
| *H01M 10/42* | (2006.01) |
| *G01R 31/36* | (2020.01) |
| *G01R 31/382* | (2019.01) |
| *G01R 31/367* | (2019.01) |

(52) U.S. Cl.
CPC ......... *H01M 10/441* (2013.01); *H01M 10/46* (2013.01); *H01M 10/48* (2013.01); *H01M 10/482* (2013.01); *H01M 10/488* (2013.01); *H02J 7/0016* (2013.01); *H02J 7/0018* (2013.01); *H02J 7/0022* (2013.01); *H02J 7/0026* (2013.01); *G01R 31/367* (2019.01); *G01R 31/3648* (2013.01); *G01R 31/382* (2019.01); *H01M 2010/4271* (2013.01)

(56) References Cited

U.S. PATENT DOCUMENTS

2014/0333315 A1* 11/2014 Yamamoto ......... G01R 31/3187
  324/426
2015/0012781 A1* 1/2015 Katrak .................... G06F 11/10
  714/37
2015/0270727 A1* 9/2015 Fukute .................. B60L 3/0046
  320/107

OTHER PUBLICATIONS

U.S. Appl. No. 16/031,333, filed Jul. 10, 2018 entitled Battery Management System That Detects Communication Faults.
U.S. Appl. No. 16/032,293, filed Jul. 11, 2018 entitled Battery Management System.
U.S. Appl. No. 16/046,965, filed Jul. 26, 2018 entitled Self-Diagnosing Battery Cell Monitoring System.

* cited by examiner

MESSAGE ─360

| FIRST OVERVOLTAGE FAULT BIT | SECOND OVERVOLTAGE FAULT BIT | THIRD OVERVOLTAGE FAULT BIT | FOURTH OVERVOLTAGE FAULT BIT |
|---|---|---|---|
| 1 | 0 | 0 | 0 |

FIG. 2

FIRST MEMORY BUFFER ─306

| FIRST OVERVOLTAGE FAULT BIT | SECOND OVERVOLTAGE FAULT BIT | THIRD OVERVOLTAGE FAULT BIT | FOURTH OVERVOLTAGE FAULT BIT |
|---|---|---|---|
| 1 | 0 | 0 | 0 |

FIG. 3

SECOND MEMORY BUFFER ─308

| FIRST OVERVOLTAGE FAULT BIT | SECOND OVERVOLTAGE FAULT BIT | THIRD OVERVOLTAGE FAULT BIT | FOURTH OVERVOLTAGE FAULT BIT |
|---|---|---|---|
| 1 | 0 | 0 | 0 |

FIG. 4

BATTERY CELL MANAGEMENT SYSTEM

CROSS-REFERENCE TO RELATED APPLICATION

This application claims priority to U.S. Provisional Patent Application No. 62/539,322 filed on Jul. 31, 2017, the entire contents of which are hereby incorporated by reference herein.

BACKGROUND

The inventor herein has recognized a need for an improved battery cell management system that redundantly determines whether a battery cell has an overvoltage condition utilizing first and second encoded overvoltage fault indicators, and to redundantly take safe action if either of the first and second encoded overvoltage fault indicators indicate an overvoltage condition is detected in the battery cell.

SUMMARY

A battery cell management system in accordance with an exemplary embodiment is provided. The battery cell management system includes a microcontroller having first and second applications and first and second memory buffers. The first memory buffer has a first overvoltage fault bit associated with a first battery cell. The second memory buffer has a second overvoltage fault bit associated with the first battery cell. The first application sets a first encoded overvoltage fault indicator equal to a first fault value if the first overvoltage fault bit of the first memory buffer is equal to a first binary value. The first application receives a second encoded overvoltage fault indicator associated with the second overvoltage fault bit from the second application. The first application commands a digital input-output device to generate control signals to transition a contactor to an open operational state if either the first encoded overvoltage fault indicator is equal to the first fault value or the second encoded overvoltage fault indicator is equal to a second fault value. The first fault value has a Hamming distance of at least four from the second fault value.

BRIEF DESCRIPTION OF THE DRAWINGS

FIG. 2 is a schematic of a message having overvoltage fault bits that are sent from a battery cell voltage measurement IC to a microcontroller in the battery cell management system of FIG. 1;

FIG. 3 is a schematic of a first memory buffer utilized by the battery cell management system of FIG. 1;

FIG. 4 is a schematic of a second memory buffer utilized by the battery cell management system of FIG. 1;

DETAILED DESCRIPTION

Figure 1:
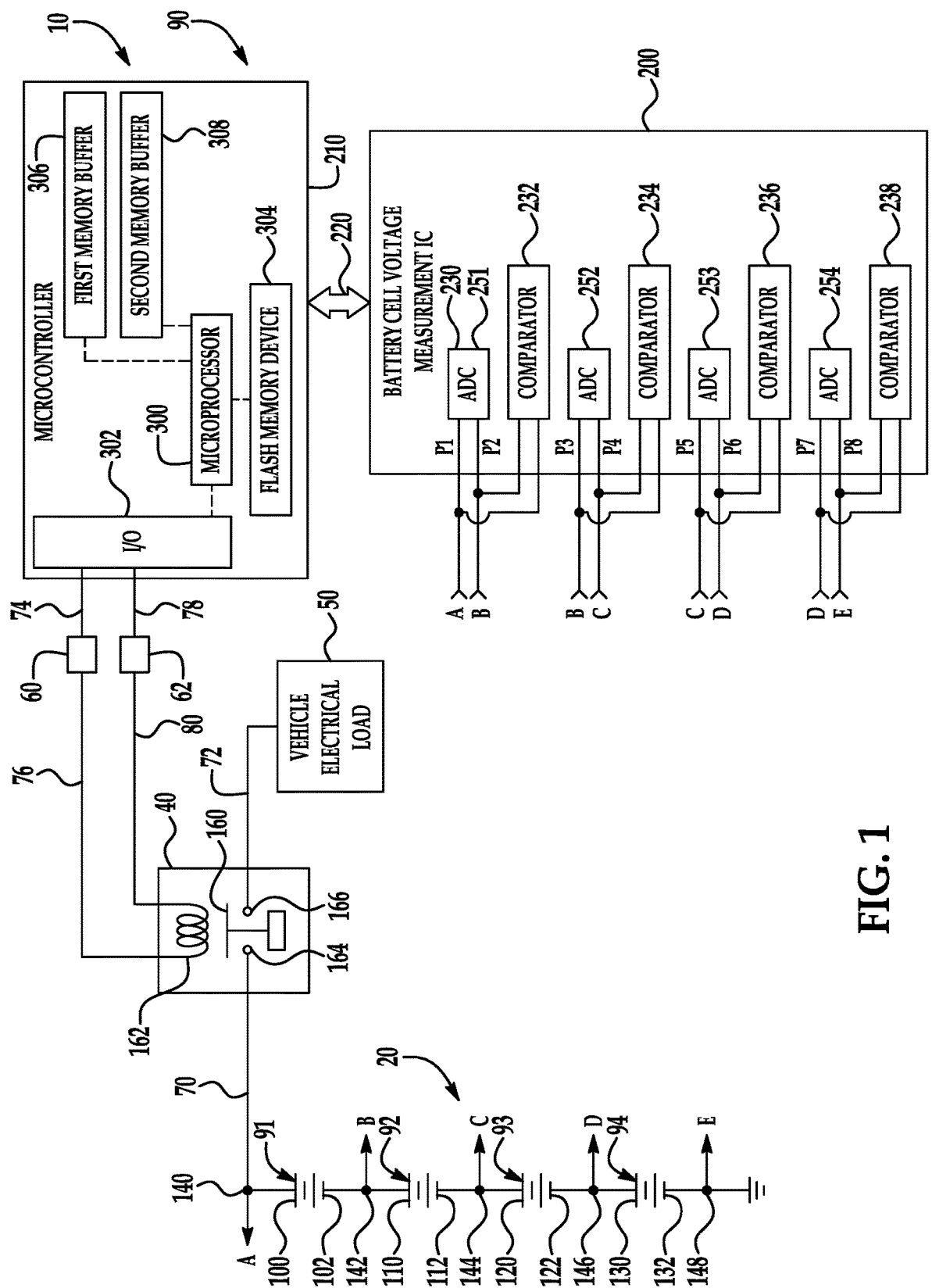
FIG. 1 is a schematic of a vehicle having a battery pack and a battery cell management system in accordance with an exemplary embodiment.

Referring to FIG. 1, a vehicle 10 is provided. The vehicle 10 includes a battery pack 20, a contactor 40, a vehicle electrical load 50, voltage drivers 60, 62, electrical lines 70, 72, 74, 76, 78, 80, and a battery cell management system 90.

An advantage of the battery cell management system 90 is that the system 90 redundantly determines whether a battery cell has an overvoltage condition utilizing first and second encoded overvoltage fault indicators, and to redundantly take safe action if either of the first and second encoded overvoltage fault indicators indicate an overvoltage condition is detected in the battery cell.

For purposes of understanding, a few terms utilized herein will be described.

The term "node" or "electrical node" refers to a region or a location in an electrical circuit.

The term "IC" refers to an integrated circuit.

The battery pack 20 includes first, second, third, fourth battery cells 91, 92, 93, 94 that are electrically coupled in series to one another. The first battery cell 91 includes a positive terminal 100 and a negative terminal 102, and the second battery cell 92 includes a positive terminal 110 and a negative terminal 112. Further, the third battery cell 93 includes a positive terminal 120 and a negative terminal 122, and the fourth battery cell 94 includes a positive terminal 130 and a negative terminal 132. The negative terminal 100 is electrically coupled to the positive terminal 110, and the negative terminal 112 is electrically coupled to the positive terminal 120. Further, the negative terminal 122 is electrically coupled to the positive terminal 130, and the negative terminal 132 is electrically coupled to electrical ground.

An electrical node 140 is electrically coupled to the positive terminal 100 of the first battery cell 91, and is further electrically coupled to the analog-to-digital converter 230, in the battery cell voltage measurement IC 200. Also, an electrical node 142 is electrically coupled to the positive terminal 110 of the second battery cell 92, and is further electrically coupled to the battery cell voltage measurement IC 200. Further, an electrical node 144 is electrically coupled to the positive terminal 120 of the third battery cell 93, and is further electrically coupled to the battery cell voltage measurement IC 200. Also, an electrical node 146 is electrically coupled to the positive terminal 130 of the fourth battery cell 94, and is further electrically coupled to the battery cell voltage measurement IC 200. Further, an electrical node 148 is electrically coupled to electrical ground, and is further electrically coupled to the battery cell voltage measurement IC 200.

The contactor 40 has a contact 160, a contactor coil 162, a first electrical node 164, and a second electrical node 166. The first electrical node 164 is electrically coupled to the positive terminal 100 of the first battery cell 91 via the electrical line 70. The second electrical node 166 is electrically coupled to the vehicle electrical load 50 via the electrical line 72. A first end of the contactor coil 162 is electrically coupled to the voltage driver 60 via the electrical line 76. The voltage driver 60 is further electrical coupled to the digital input-output device 302 of the microcontroller 210 via the electrical line 74. A second end of the contactor coil 162 is electrically coupled to the voltage driver 62 via the electrical line 80. The voltage driver 62 is further electrically coupled to the digital input-output device 302 of the microcontroller 210 via the electrical line 78.

When the microcontroller 210 generates first and second control signals that are received by the voltage drivers 60, 62, respectively, the contactor coil 162 is energized which transitions the contact 160 to a closed operational state, which results in the vehicle electrical load 50 receiving a voltage from the battery pack 20. Alternately, when the microcontroller 210 generates third and fourth control signals that are received by the voltage drivers 60, 62, respectively, the contactor coil 162 is de-energized which transitions the contact 160 to an open operational state. In an exemplary embodiment, the third and fourth control signals can each be a ground voltage level.

The battery cell management system 90 is provided to determine battery cell voltage values associated with the first, second, third, fourth battery cells 91, 92, 93, 94, and to determine overvoltage fault bits associated with the battery cells 91, 92, 93, 94. The battery cell management system 90 includes a battery cell voltage measurement IC 200, a microcontroller 210, and a communication bus 220.

The battery cell voltage measurement IC 200 is provided to measure battery cell voltages of the first, second, third, fourth battery cells 91, 92, 93, 94 and to generate associated battery cell voltage values. The battery cell voltage measurement IC 200 is further provided to generate overvoltage fault bits associated with the battery cells 91, 92, 93, 94. The battery cell voltage measurement IC 200 includes an analog-to-digital converter (ADC) 230, and first, second, third, and fourth voltage comparators 232, 234, 236, 238.

The ADC 230 includes ADC differential channels 251, 252, 253, 254 for measuring battery cell voltages of the first, second, third, fourth battery cells 91, 92, 93, 94, respectively.

The ADC differential channel 251 has input pins P1, P2 which are electrically coupled to the positive terminal 100 and the negative terminal 102, respectively, of the first battery cell 91 to measure an output voltage of the first battery cell 91 between the terminals 100, 102, and the analog-to-digital converter 230 generates a battery cell voltage value based on the measured output voltage.

The ADC differential channel 252 has input pins P3, P4 which are electrically coupled to the positive terminal 110 and the negative terminal 112, respectively, of the second battery cell 92 to measure an output voltage of the second battery cell 92 between the terminals 110, 112, and the analog-to-digital converter 230 generates a battery cell voltage value based on the measured output voltage.

The ADC differential channel 253 has input pins P5, P6 which are electrically coupled to the positive terminal 120 and the negative terminal 122, respectively, of the third battery cell 93 to measure an output voltage of the third battery cell 93 between the terminals 120, 122, and the analog-to-digital converter 230 generates a battery cell voltage value based on the measured output voltage.

The ADC differential channel 254 has input pins P7, P8 which are electrically coupled to the positive terminal 130 and the negative terminal 132, respectively, of the fourth battery cell 94 to measure an output voltage of the fourth battery cell 94 between the terminals 130, 132, and the analog-to-digital converter 230 generates a battery cell voltage value based on the measured output voltage.

The first voltage comparator 232 is electrically coupled to the input pins P1, P2 of the ADC differential channel 251, and compares the output voltage (between input pins P1, P2) of the first battery cell 91 to a voltage comparator threshold voltage. If the output voltage of the first battery cell 91 is greater than the voltage comparator threshold voltage indicating a cell overvoltage condition, the first voltage comparator 232 sets an associated overvoltage fault bit to a binary "1" value (i.e., a fault value). Otherwise, the first voltage comparator 232 sets the associated overvoltage fault bit to a binary "0" value (i.e., a non-fault value).

The second voltage comparator 234 is electrically coupled to the input pins P3, P4 of the ADC differential channel 252, and compares the output voltage (between input pins P3, P4) of the second battery cell 92 to a voltage comparator threshold voltage. If the output voltage of the second battery cell 92 is greater than the voltage comparator threshold voltage indicating a cell overvoltage condition, the second voltage comparator 234 sets an associated overvoltage fault bit to a binary "1" value (i.e., a fault value). Otherwise, the second voltage comparator 234 sets the associated overvoltage fault bit to a binary "0" value.

The third voltage comparator 236 is electrically coupled to the input pins P5, P6 of the ADC differential channel 253, and compares the output voltage (between input pins P5, P6) of the third battery cell 93 to a voltage comparator threshold voltage. If the output voltage of the third battery cell 93 is greater than the voltage comparator threshold voltage indicating a cell overvoltage condition, the third voltage comparator 236 sets an associated overvoltage fault bit to a binary "1" value (i.e., a fault value). Otherwise, the third voltage comparator 236 sets the associated overvoltage fault bit to a binary "0" value.

The fourth voltage comparator 238 is electrically coupled to the input pins P7, P8 of the ADC differential channel 254, and compares the output voltage (between input pins P7, P8) of the fourth battery cell 94 to a voltage comparator threshold voltage. If the output voltage of the fourth battery cell 94 is greater than the voltage comparator threshold voltage indicating a cell overvoltage condition, the fourth voltage comparator 238 sets an associated overvoltage fault bit to a binary "1" value (i.e., a fault value). Otherwise, the fourth voltage comparator 238 sets the associated overvoltage fault bit to a binary "0" value.

The battery cell voltage measurement IC 200 operably communicates with the microcontroller 210 via the communication bus 220. In particular, the battery cell voltage measurement IC 200 sends battery cell voltage values and overvoltage fault bits to the microcontroller 210 via the communication bus 220.

The microcontroller 210 is provided to control operation of the contactor 40 and to monitor the battery cell voltage values and the overvoltage fault bits associated with the first, second, third, fourth battery cells 91, 92, 93, 94. The microcontroller 210 includes a microprocessor 300, a digital input-output device 302, a flash memory device 304, and first and second memory buffers 306, 308. The microprocessor 300 is operably coupled to the digital input-output device 302, the flash memory device 304, and the first and second memory buffers 306, 308. The digital input-output device 302 is electrically coupled to the voltage drivers 60, 62 via the electrical lines 74, 78, respectively.

Figure 12:
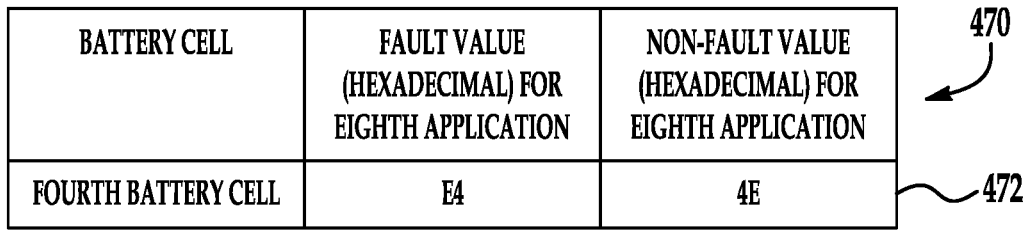
FIG. 12 is a table having a fault value and a non-fault value for an eighth encoded overvoltage fault indicator associated with the fourth battery cell.
Figure 13:
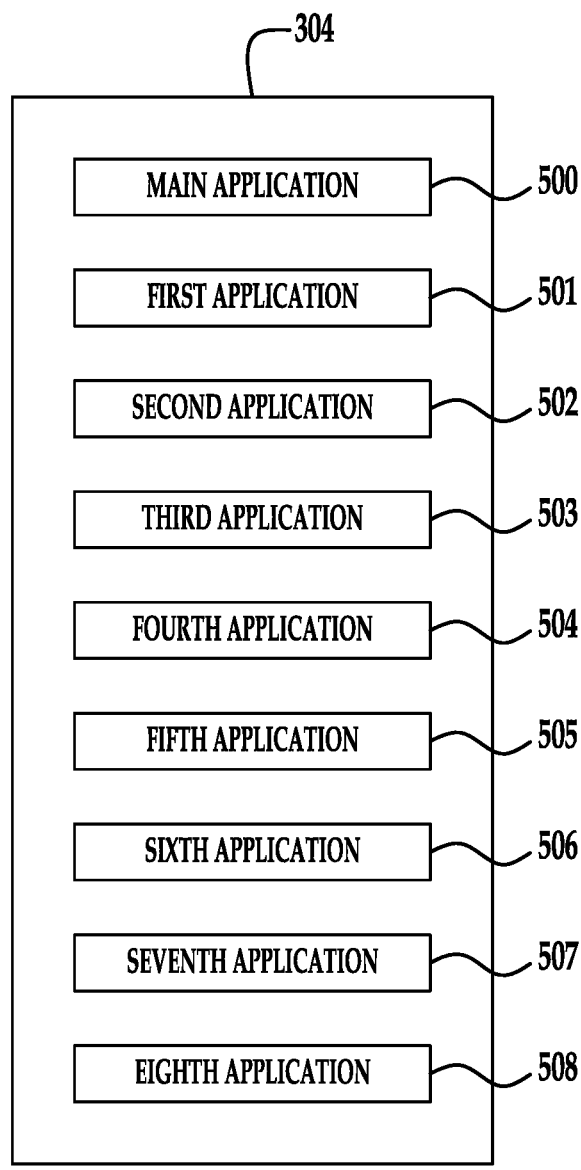
FIG. 13 is a block diagram of a main application, and first, second, third, fourth, fifth, sixth, seventh, and eighth applications utilized by a microcontroller in the battery cell management system of FIG. 1.
Figure 14:
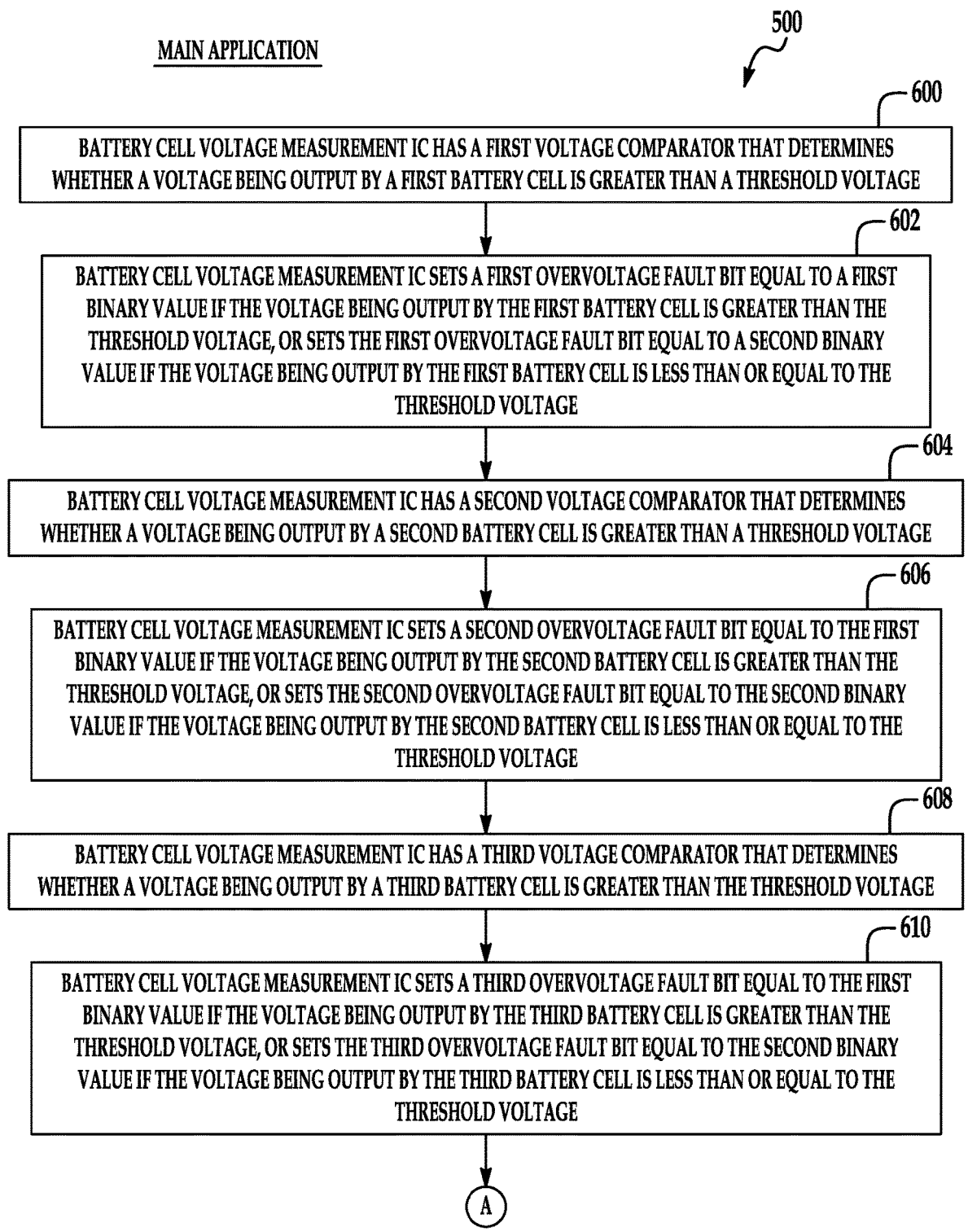
FIGS. 14-24 are flowcharts associated with the method for detecting battery cell overvoltage conditions utilizing the main application, and the first, second, third, fourth, fifth, sixth, seventh, and eighth applications.
Figure 15:
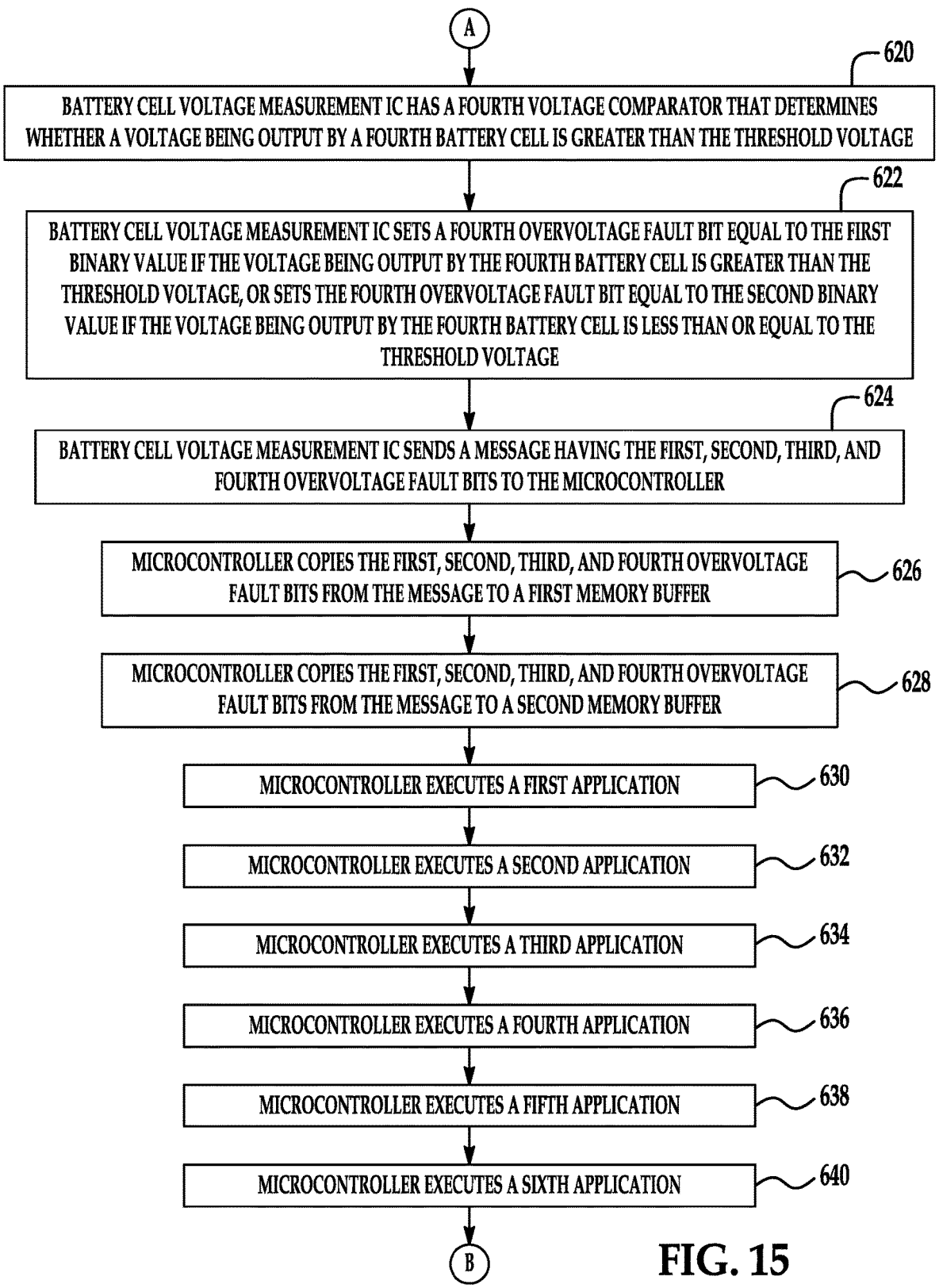
Figure 16:
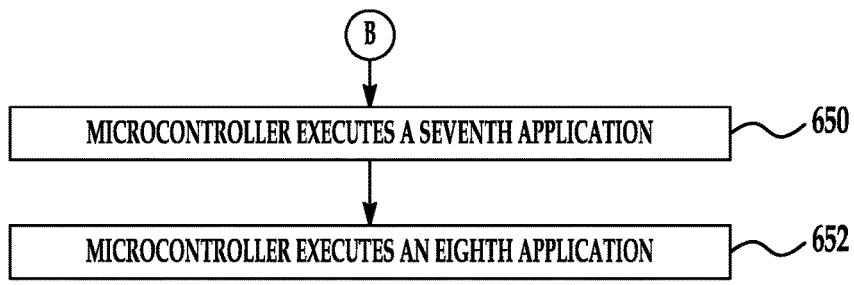

Referring to FIGS. 1 and 13, the flash memory device 304 includes a main application 500, a first application 501, a second application 502, a third application 503, a fourth application 504, a fifth application 505, a sixth application 506, a seventh application 507, and an eighth application 508 stored therein which is executed by the microprocessor 300. Further, referring to FIGS. 1 and 5-12, the memory device 304 stores tables 400, 410, 420, 430, 440, 450, 460, 470 therein.

Referring to FIG. 2, an exemplary message 360 that is sent from the battery cell voltage measurement IC 200 to the microcontroller 210 is illustrated. The message 360 includes first, second, third, fourth overvoltage fault bits associated with the first, second, third, fourth battery cells 91, 92, 93, 94, respectively is shown. In particular, the first overvoltage fault bit has a binary "1" value indicating overvoltage condition in the first battery cell 91. The second overvoltage fault bit has a binary "0" value indicating a desired voltage condition in the second battery cell 92. The third overvoltage fault bit has a binary "0" value indicating a desired voltage condition in the third battery cell 93. Further, the fourth overvoltage fault bit has a binary "0" value indicating a desired voltage condition in the fourth battery cell 94.

Referring to FIG. 3, exemplary contents of the first memory buffer 306 is illustrated. The microcontroller 210 copies the first, second, third, fourth overvoltage fault bits of the message 360 into the first memory buffer 306. Accordingly, the first memory buffer 306 has the first overvoltage fault bit with the binary "1" value indicating an overvoltage condition in the first battery cell 91. Further, the first memory buffer 306 has the second overvoltage fault bit with the binary "0" value indicating a desired voltage condition in the second battery cell 92. Further, the first memory buffer 306 has the third overvoltage fault bit with the binary "0" value indicating a desired voltage condition in the third battery cell 93. Further, the first memory buffer 306 has the fourth overvoltage fault bit with the binary "0" value indicating a desired voltage condition in the fourth battery cell 94.

Referring to FIG. 4, exemplary contents of the second memory buffer 308 is illustrated. The microcontroller 210 copies the first, second, third, fourth overvoltage fault bits of the message 360 into the second memory buffer 308. Accordingly, the second memory buffer 308 has the first overvoltage fault bit with the binary "1" value indicating an overvoltage condition in the first battery cell 91. Further, the second memory buffer 308 has the second overvoltage fault bit with the binary "0" value indicating a desired voltage condition in the second battery cell 92. Further, the second memory buffer 308 has the third overvoltage fault bit with the binary "0" value indicating a desired voltage condition in the third battery cell 93. Further, the second memory buffer 308 has the fourth overvoltage fault bit with the binary "0" value indicating a desired voltage condition in the fourth battery cell 94.

The purpose of the two memory buffers 306, 308 is to provide separate and distinct memory locations for redundantly determining whether a battery cell has an overvoltage condition.

Figure 5:
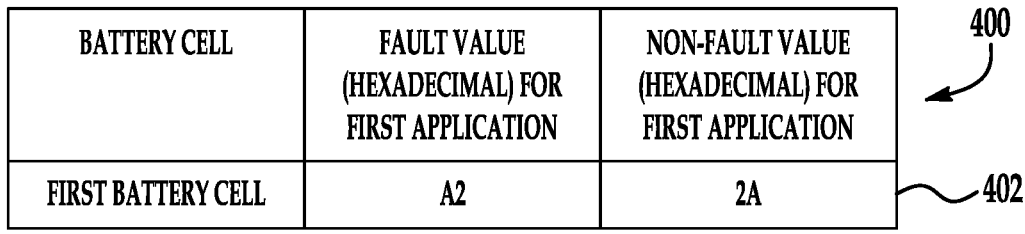
FIG. 5 is a table having a fault value and a non-fault value for a first encoded overvoltage fault indicator associated with a first battery cell.

Referring to FIGS. 5 and 13, a table 400 having a fault value (e.g., A2 hexadecimal which is also known as an encoded fault value), and a non-fault value (e.g., 2A hexadecimal which is also known as an encoded non-fault value) for a first encoded overvoltage fault indicator that is associated with the first battery cell 91 and utilized by the first application 501 is illustrated.

Figure 6:
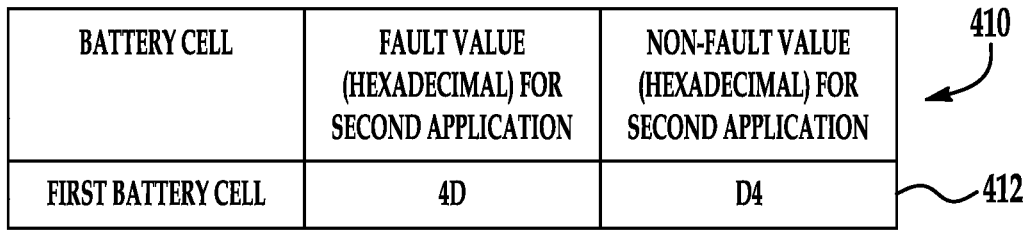
FIG. 6 is a table having a fault value and a non-fault value for a second encoded overvoltage fault indicator associated with the first battery cell.

Referring to FIGS. 6 and 13, a table 410 having a fault value (e.g., 4D hexadecimal which is also known as an encoded fault value) and a non-fault value (e.g., D4 hexadecimal which is also known as an encoded non-fault value) for a second encoded overvoltage fault indicator that is associated with the first battery cell 91 and utilized by the second application 502 is illustrated.

Figure 7:
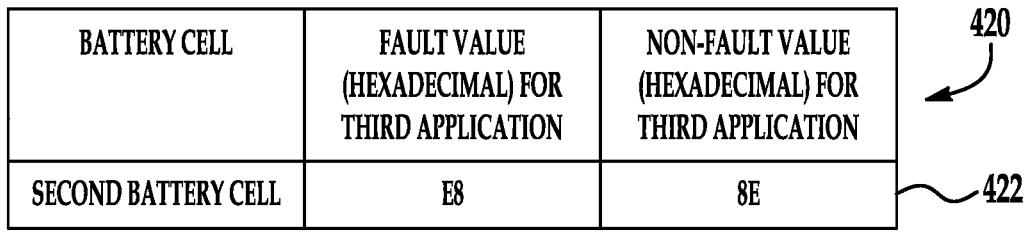
FIG. 7 is a table having a fault value and a non-fault value for a third encoded overvoltage fault indicator associated with a second battery cell.

Referring to FIGS. 7 and 13, a table 420 having a fault value (e.g., E8 hexadecimal which is also known as an encoded fault value) and a non-fault value (e.g., 8E hexadecimal which is also known as an encoded non-fault value) for a third encoded overvoltage fault indicator that is associated with the second battery cell 92 and utilized by the third application 503 is illustrated.

Figure 8:
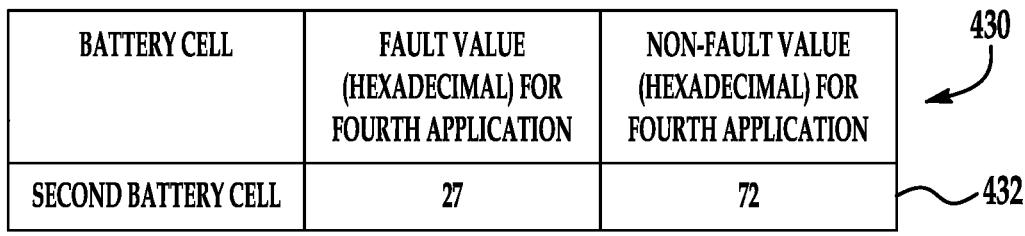
FIG. 8 is a table having a fault value and a non-fault value for a fourth encoded overvoltage fault indicator associated with the second battery cell.

Referring to FIGS. 8 and 13, a table 430 having a fault value (e.g., 27 hexadecimal which is also known as an encoded fault value) and a non-fault value (e.g., 72 hexadecimal which is also known as an encoded non-fault value) for a fourth encoded overvoltage fault indicator that is associated with the second battery cell 92 and utilized by the fourth application 504 is illustrated.

Figure 9:
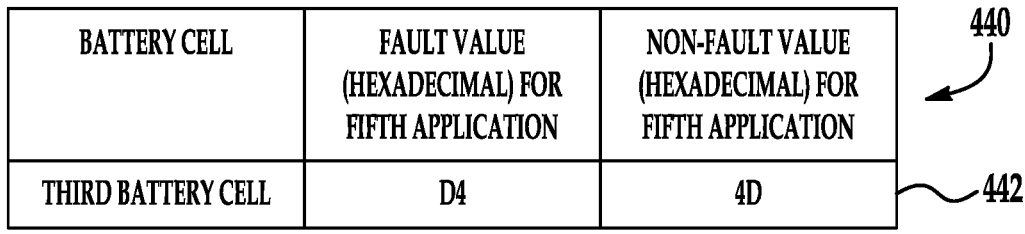
FIG. 9 is a table having a fault value and a non-fault value for a fifth encoded overvoltage fault indicator associated with a third battery cell.

Referring to FIGS. 9 and 13, a table 440 having a fault value (e.g., D4 hexadecimal which is also known as an encoded fault value) and a non-fault value (e.g., 4D hexadecimal which is also known as an encoded non-fault value) for a fifth encoded overvoltage fault indicator that is associated with the third battery cell 93 and utilized by the fifth application 505 is illustrated.

Figure 10:
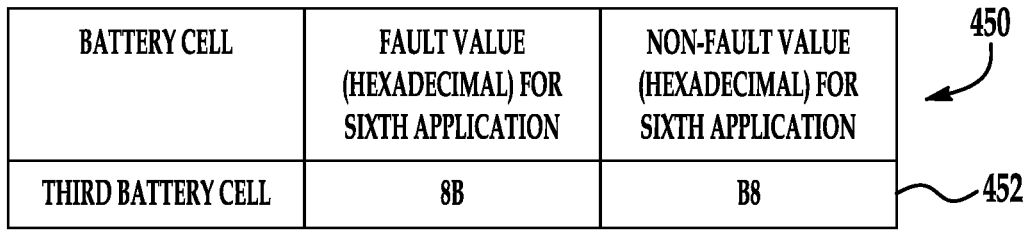
FIG. 10 is a table having a fault value and a non-fault value for a sixth encoded overvoltage fault indicator associated with the third battery cell.

Referring to FIGS. 10 and 13, a table 450 having a fault value (e.g., 8B hexadecimal which is also known as an encoded fault value) and a non-fault value (e.g., B8 hexadecimal which is also known as an encoded non-fault value) for a sixth encoded overvoltage fault indicator that is associated with the third battery cell 93 and utilized by the sixth application 506 is illustrated.

Figure 11:
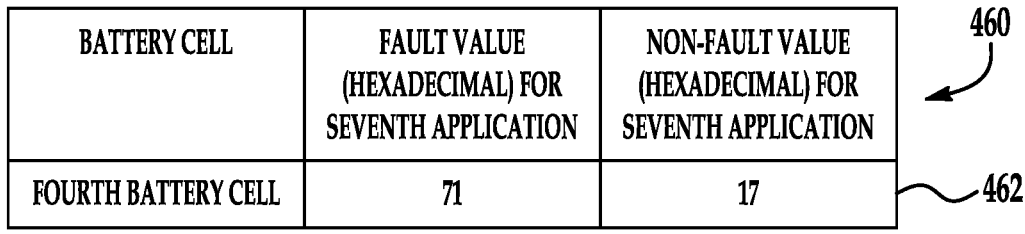
FIG. 11 is a table having a fault value and a non-fault value for a seventh encoded overvoltage fault indicator associated with a fourth battery cell.

Referring to FIGS. 11 and 13, a table 460 having a fault value (e.g., 71 hexadecimal which is also known as an encoded fault value) and a non-fault value (e.g., 17 hexadecimal which is also known as an encoded non-fault value) for a seventh encoded overvoltage fault indicator that is associated with the fourth battery cell 94 and utilized by the seventh application 507 is illustrated.

Referring to FIGS. 12 and 13, a table 470 having a fault value (e.g., E4 hexadecimal which is also known as an encoded fault value) and a non-fault value (e.g., 4E hexadecimal which is also known as an encoded non-fault value) for an eighth encoded overvoltage fault indicator that is associated with the fourth battery cell 94 and utilized by the eighth application 508 is illustrated.

Referring to FIGS. 5-12, the fault values and non-fault values in each of the tables 400, 410, 420, 430, 440, 450, 460, 470 each have a Hamming distance of at least four from one another.

Referring to FIGS. 1 and 4-24, a flowchart of a method for detecting battery cell overvoltage conditions utilizing the main application 500, and the first, second, third, fourth, fifth, sixth, seventh, and eighth applications 501, 502, 503, 504, 505, 506, 507, 508 will be explained.

Referring to FIGS. 1 and 14-16, the main application 500 will now be explained. It is noted that some steps of the main application 500 are performed by the battery cell voltage measurement IC 200 which is external to the microcontroller 210. Also, other steps of the main application 500 are performed by the microcontroller 210.

At step 600, the battery cell voltage measurement IC 200 has a first voltage comparator 232 that determines whether a voltage being output by a first battery cell 91 is greater than a threshold voltage.

At step 602, the battery cell voltage measurement IC 200 sets a first overvoltage fault bit equal to a first binary value if the voltage being output by the first battery cell 91 is greater than the threshold voltage, or sets the first overvoltage fault bit equal to a second binary value if the voltage being output by the first battery cell 91 is less than or equal to the threshold voltage.

At step 604, the battery cell voltage measurement IC 200 has a second voltage comparator 234 that determines whether a voltage being output by a second battery cell 92 is greater than the threshold voltage.

At step 606, the battery cell voltage measurement IC 200 sets a second overvoltage fault bit equal to the first binary value if the voltage being output by the second battery cell 92 is greater than the threshold voltage, or sets the second overvoltage fault bit equal to the second binary value if the voltage being output by the second battery cell 92 is less than or equal to the threshold voltage.

At step 608, the battery cell voltage measurement IC 200 has a third voltage comparator 236 that determines whether a voltage being output by a third battery cell 93 is greater than the threshold voltage.

At step 610, the battery cell voltage measurement IC 200 sets a third overvoltage fault bit equal to the first binary value if the voltage being output by the third battery cell 93 is greater than the threshold voltage, or sets the third overvoltage fault bit equal to the second binary value if the voltage being output by the third battery cell 93 is less than or equal to the threshold voltage.

At step 620, the battery cell voltage measurement IC 200 has a fourth voltage comparator 238 that determines whether a voltage being output by a fourth battery cell 94 is greater than the threshold voltage.

At step 622, the battery cell voltage measurement IC 200 sets a fourth overvoltage fault bit equal to the first binary value if the voltage being output by the fourth battery cell 94 is greater than the threshold voltage, or sets the fourth overvoltage fault bit equal to the second binary value if the voltage being output by the fourth battery cell 94 is less than or equal to the threshold voltage.

At step 624, the battery cell voltage measurement IC 200 sends a message 360 having the first, second, third, and fourth overvoltage fault bits (e.g., 1000 binary) to the microcontroller 210.

At step 626, the microcontroller 210 copies the first, second, third, and fourth overvoltage fault bits (e.g., 1000 binary) from the message 360 to a first memory buffer 306.

At step 628, the microcontroller 210 copies the first, second, third, and fourth overvoltage fault bits (e.g., 1000 binary) from the message 360 to a second memory buffer 308.

At step 630, the microcontroller 210 executes the first application 501.

At step 632, the microcontroller 210 executes a second application 502. It is noted that the first and second applications 501, 502 can be concurrently executed in two threads.

At step 634, the microcontroller 210 executes the third application 503.

At step 636, the microcontroller 210 executes the fourth application 504. It is noted that the third and fourth applications 503, 504 can be concurrently executed in two threads.

At step 638, the microcontroller 210 executes the fifth application 505.

At step 640, the microcontroller 210 executes the sixth application 506. It is noted that the fifth and sixth applications 505, 506 can be concurrently executed in two threads.

At step 650, the microcontroller 210 executes a seventh application 507.

At step 652, the microcontroller 210 executes the eighth application 508. It is noted that the fifth and sixth applications 505, 506 can be concurrently executed in two threads.

Figure 17:
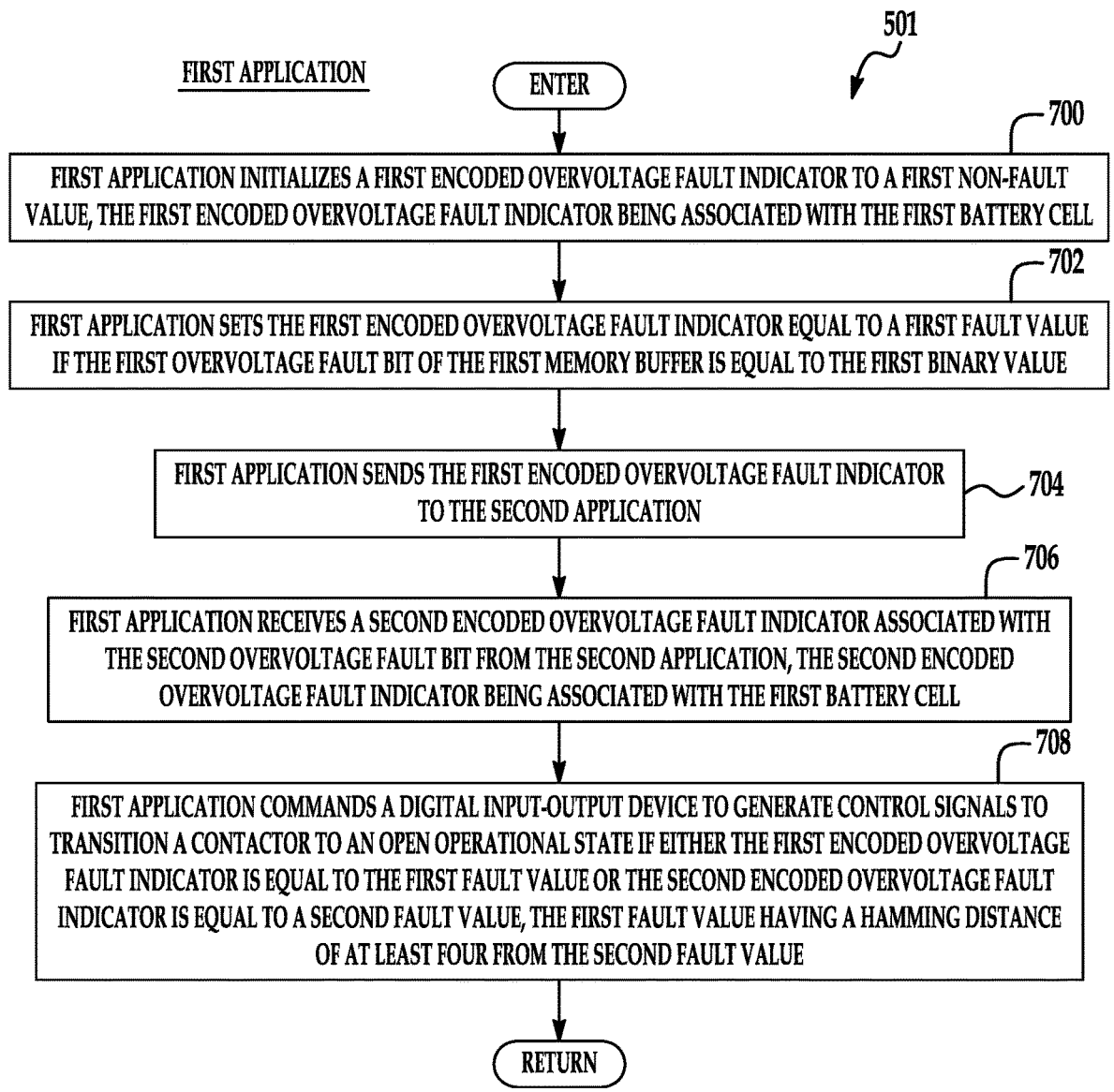

Referring to FIGS. 1, 5 and 17, the first application 501 will now be explained. The first application 501 reads the table 400 to access the values therein.

At step 700, the first application 501 initializes a first encoded overvoltage fault indicator to a first non-fault value (e.g., 2A hexadecimal shown in record 402 in table 400 of FIG. 5). The first encoded overvoltage fault indicator is associated with the first battery cell 91.

At step 702, the first application 501 sets the first encoded overvoltage fault indicator equal to a first fault value (e.g., A2 hexadecimal shown in record 402 in table 400 of FIG. 5) if the first overvoltage fault bit of the first memory buffer 306 is equal to the first binary value.

At step 704, the first application 501 sends the first encoded overvoltage fault indicator to the second application 502.

At step 706, the first application 501 receives a second encoded overvoltage fault indicator associated with the second overvoltage fault bit from the second application 502. The second encoded overvoltage fault indicator is associated with the first battery cell 91.

At step 708, the first application 501 commands a digital input-output device 302 to generate control signals to transition a contactor 40 to an open operational state if either the first encoded overvoltage fault indicator is equal to the first fault value or the second encoded overvoltage fault indicator is equal to a second fault value (e.g., 4D hexadecimal shown in record 412 in table 410 of FIG. 6). The first fault value has a Hamming distance of at least four from the second fault value.

Figure 18:
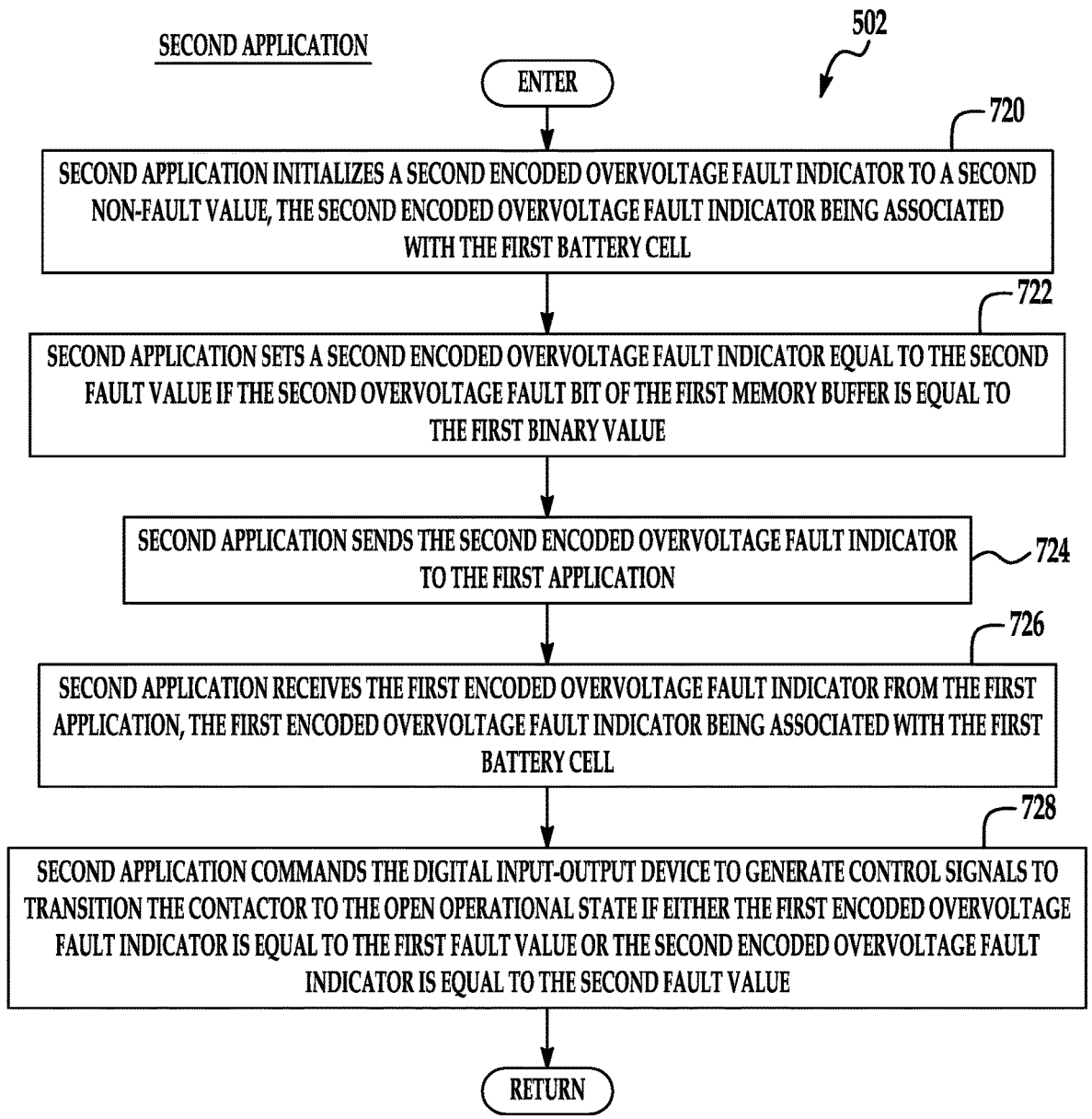

Referring to FIGS. 1, 6 and 18, the second application 502 will now be explained. The second application 502 reads the table 410 to access the values therein.

At step 720, the second application 502 initializes a second encoded overvoltage fault indicator to a second non-fault value (e.g., D4 hexadecimal shown in record 412 in table 410 of FIG. 6). The second encoded overvoltage fault indicator is associated with the first battery cell 91.

At step 722, the second application 502 sets a second encoded overvoltage fault indicator equal to the second fault value (e.g., 4D hexadecimal shown in record 412 in table 410 of FIG. 6) if the second overvoltage fault bit of the first memory buffer 306 is equal to the first binary value.

At step 724, the second application 502 sends the second encoded overvoltage fault indicator to the first application 501.

At step 726, the second application 502 receives the first encoded overvoltage fault indicator from the first application 501. The first encoded overvoltage fault indicator is associated with the first battery cell 91.

Figure 19:
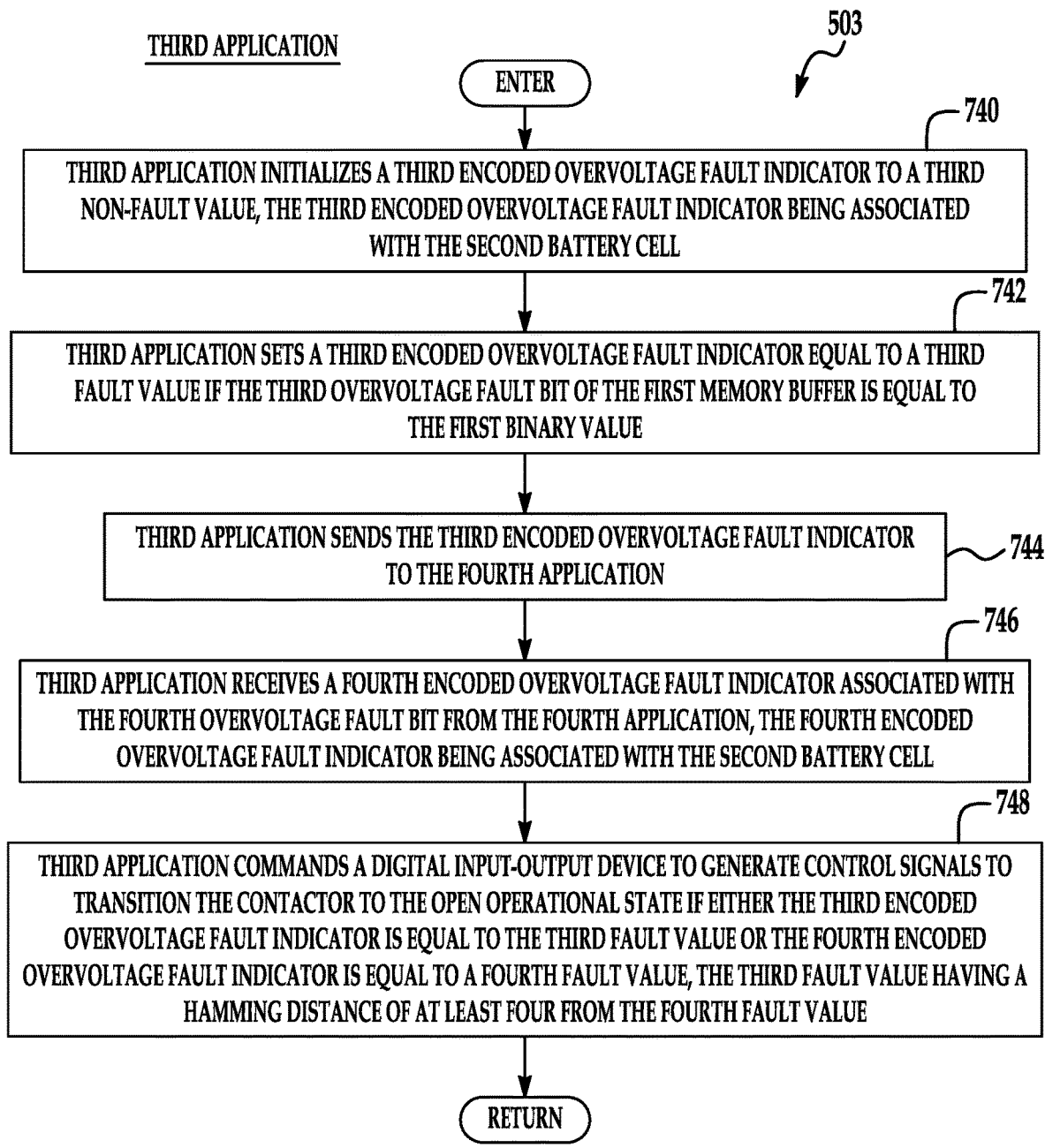

At step 728, the second application 502 commands the digital input-output device 302 to generate control signals to transition the contactor 40 to the open operational state if either the first encoded overvoltage fault indicator is equal to the first fault value (e.g., A2 hexadecimal shown in record 402 in table 400 of FIG. 5) or the second encoded overvoltage fault indicator is equal to the second fault value Referring to FIGS. 1, 7 and 19, the third application 503 will now be explained. The third application 503 reads the table 420 to access the values therein.

At step 740, the third application 503 initializes a third encoded overvoltage fault indicator to a third non-fault value (e.g., 8E hexadecimal shown in record 422 in table 420 of FIG. 7). The third encoded overvoltage fault indicator is associated with the second battery cell 92.

At step 742, the third application 503 sets a third encoded overvoltage fault indicator equal to a third fault value (e.g., E8 hexadecimal shown in record 422 in table 420 of FIG. 7) if the third overvoltage fault bit of the first memory buffer 306 is equal to the first binary value.

At step 744, the third application 503 sends the third encoded overvoltage fault indicator to the fourth application 504.

At step 746, the third application 503 receives a fourth encoded overvoltage fault indicator associated with the fourth overvoltage fault bit from the fourth application 504. The fourth encoded overvoltage fault indicator is associated with the second battery cell 92.

At step 748, the third application 503 commands the digital input-output device 302 to generate control signals to transition the contactor 40 to the open operational state if either the third encoded overvoltage fault indicator is equal to the third fault value or the fourth encoded overvoltage fault indicator is equal to a fourth fault value (e.g., 27 hexadecimal shown in record 432 in table 430 of FIG. 8). The third fault value has a Hamming distance of at least four from the fourth fault value.

Figure 20:
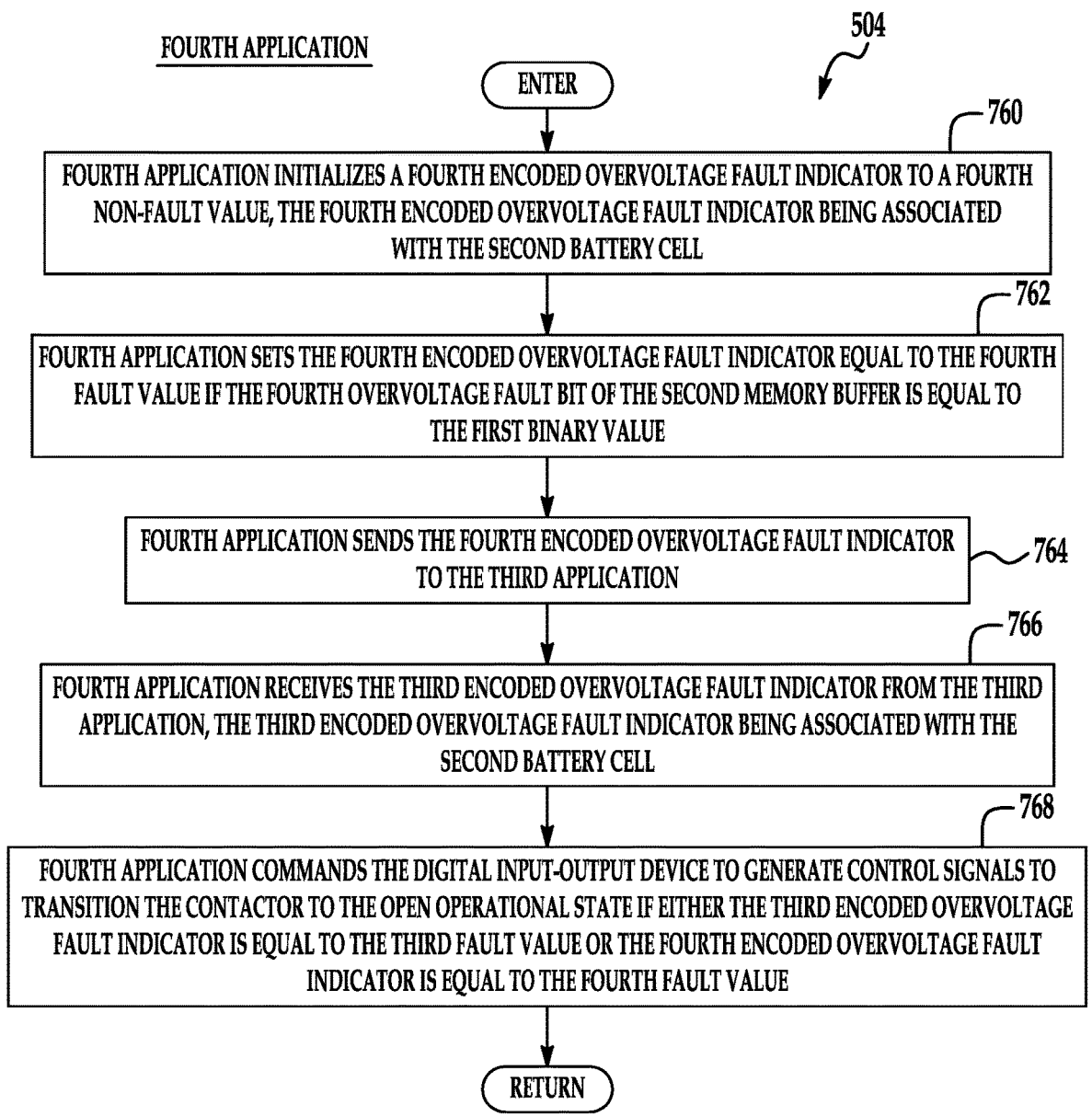

Referring to FIGS. 1, 8 and 20, the fourth application 504 will now be explained. The fourth application 504 reads the table 430 to access the values therein.

At step 760, the fourth application 504 initializes a fourth encoded overvoltage fault indicator to a fourth non-fault value (e.g., 72 hexadecimal shown in record 432 in table 430 of FIG. 8). The fourth encoded overvoltage fault indicator is associated with the second battery cell 92.

At step 762, the fourth application 504 sets the fourth encoded overvoltage fault indicator equal to the fourth fault value (e.g., 27 hexadecimal shown in record 432 in table 430 of FIG. 8) if the fourth overvoltage fault bit of the second memory buffer 308 is equal to the first binary value.

At step 764, the fourth application 504 sends the fourth encoded overvoltage fault indicator to the third application 503.

At step 766, the fourth application 504 receives the third encoded overvoltage fault indicator from the third application 503. The third encoded overvoltage fault indicator is associated with the second battery cell 92.

At step 768, the fourth application 504 commands the digital input-output device 302 to generate control signals to transition the contactor 40 to the open operational state if either the third encoded overvoltage fault indicator is equal to the third fault value (e.g., E8 hexadecimal shown in record 422 in table 420 of FIG. 7) or the fourth encoded overvoltage fault indicator is equal to the fourth fault value.

Figure 21:
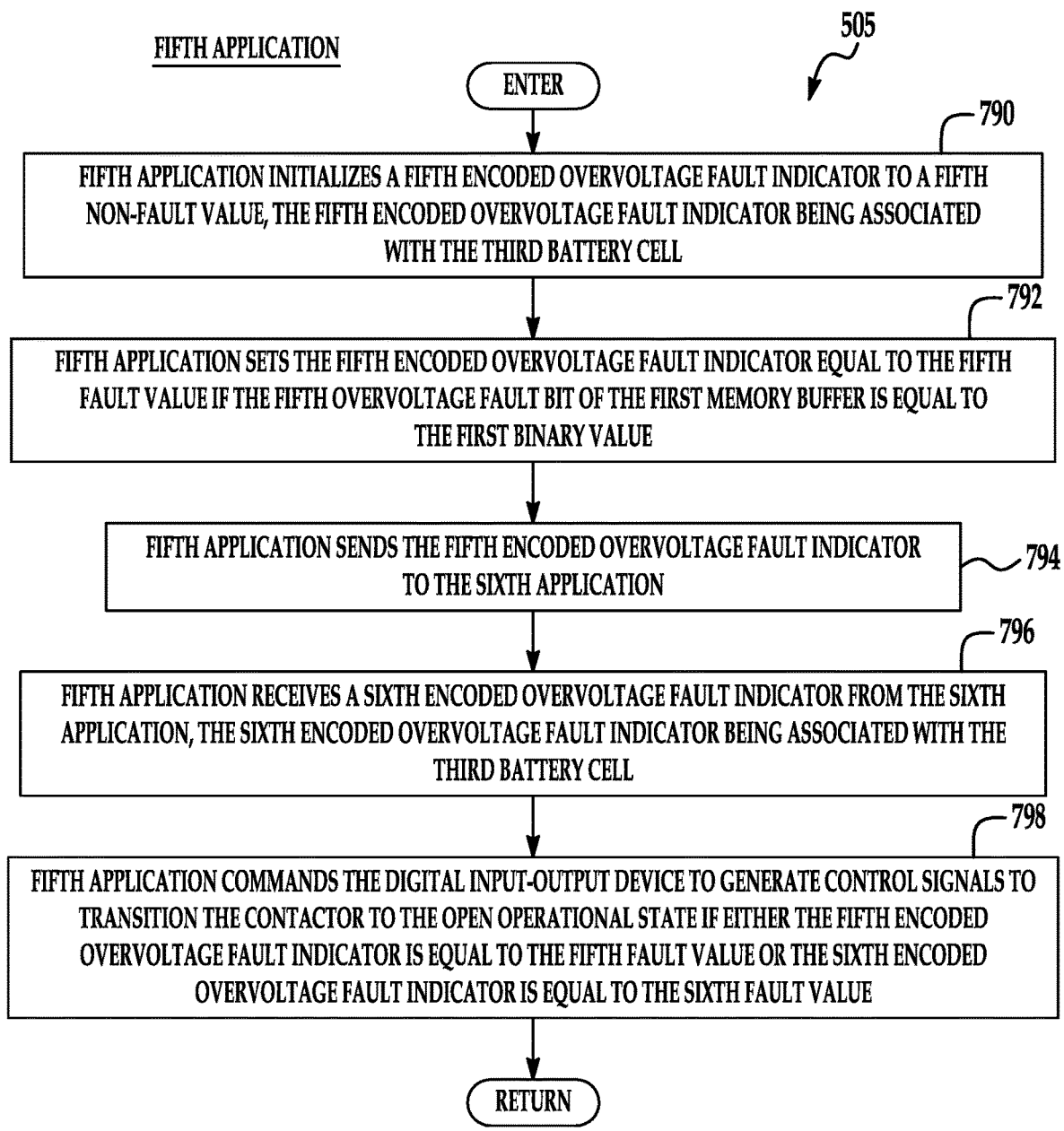

Referring to FIGS. 1, 9 and 21, the fifth application 505 will now be explained. The fifth application 505 reads the table 440 to access the values therein.

At step 790, the fifth application 505 initializes a fifth encoded overvoltage fault indicator to a fifth non-fault value (e.g., 4D hexadecimal shown in record 442 in table 440 of FIG. 9). The fifth encoded overvoltage fault indicator is associated with the third battery cell 93.

At step 792, the fifth application 505 sets the fifth encoded overvoltage fault indicator equal to the fifth fault value (e.g., D4 hexadecimal shown in record 442 in table 440 of FIG. 9) if the fifth overvoltage fault bit of the first memory buffer 306 is equal to the first binary value.

At step 794, the fifth application 505 sends the fifth encoded overvoltage fault indicator to the sixth application 506.

At step 796, the fifth application 505 receives a sixth encoded overvoltage fault indicator from the sixth application 506. The sixth encoded overvoltage fault indicator is associated with the third battery cell 93.

At step 798, the fifth application 505 commands the digital input-output device 302 to generate control signals to transition the contactor 40 to the open operational state if either the fifth encoded overvoltage fault indicator is equal to the fifth fault value or the sixth encoded overvoltage fault indicator is equal to the sixth fault value (e.g., 8B hexadecimal shown in record 452 in table 450 of FIG. 10).

Figure 22:
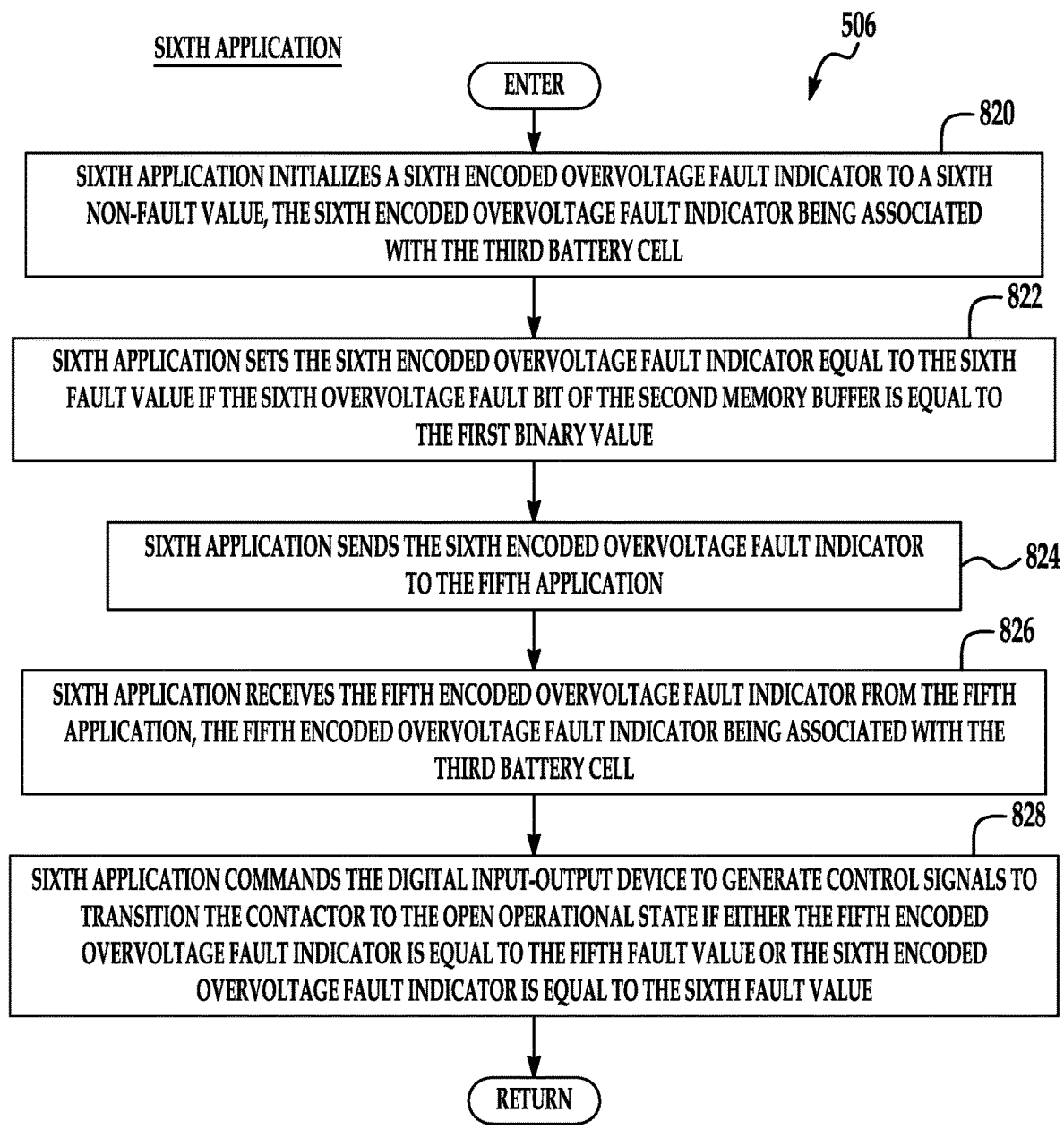

Referring to FIGS. 1 and 22, the sixth application 506 will now be explained. The sixth application 506 reads the table 450 to access the values therein.

At step 820, the sixth application 506 initializes a sixth encoded overvoltage fault indicator to a sixth non-fault value (e.g., B8 hexadecimal shown in record 452 in table 450 of FIG. 10). The sixth encoded overvoltage fault indicator is associated with the third battery cell 93.

At step 822, the sixth application 506 sets the sixth encoded overvoltage fault indicator equal to the sixth fault value (e.g., 8B hexadecimal shown in record 452 in table 450 of FIG. 10) if the sixth overvoltage fault bit of the second memory buffer 308 is equal to the first binary value.

At step 824, the sixth application 506 sends the sixth encoded overvoltage fault indicator to the fifth application 505.

At step 826, the sixth application 506 receives the fifth encoded overvoltage fault indicator from the fifth application 505. The fifth encoded overvoltage fault indicator is associated with the third battery cell 93.

At step 828, the sixth application 506 commands the digital input-output device 302 to generate control signals to transition the contactor 40 to the open operational state if either the fifth encoded overvoltage fault indicator is equal to the fifth fault value (e.g., D4 hexadecimal shown in record 442 in table 440 of FIG. 9) or the sixth encoded overvoltage fault indicator is equal to the sixth fault value.

Figure 23:
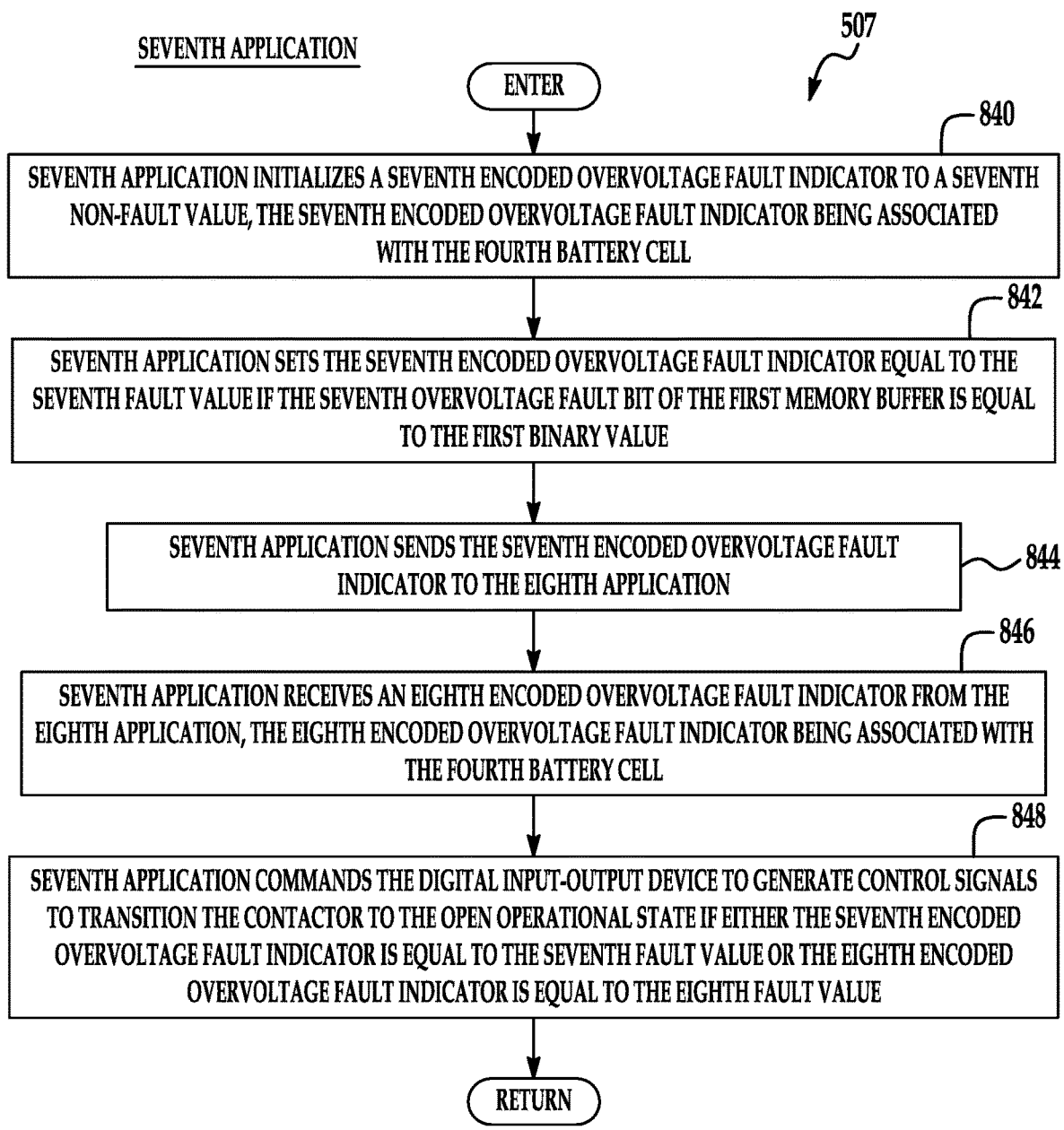
Figure 24:
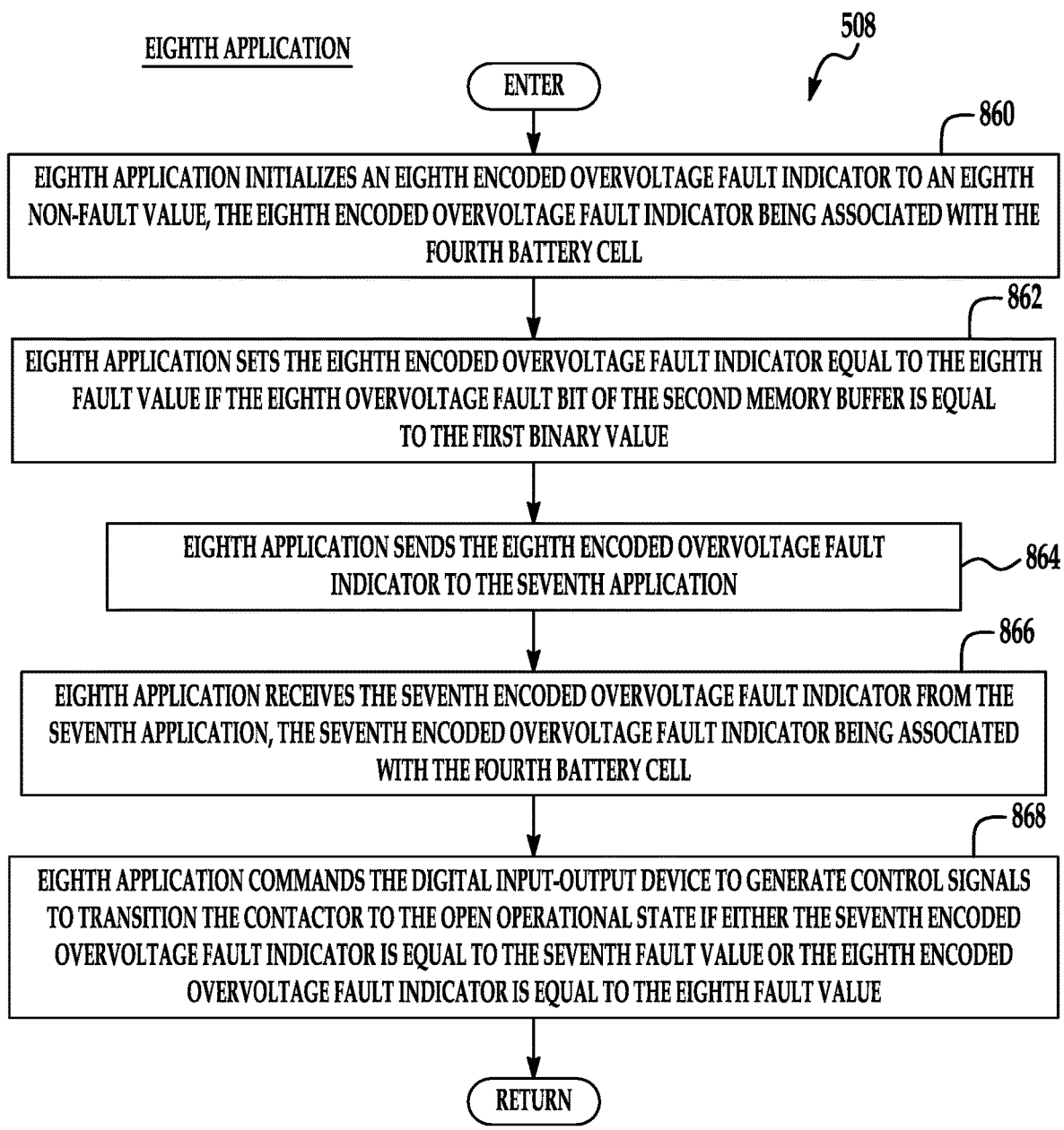

Referring to FIGS. 1, 11 and 23, the seventh application 507 will now be explained. The seventh application 507 reads the table 460 to access the values therein.

At step 840, the seventh application 507 initializes a seventh encoded overvoltage fault indicator to a seventh non-fault value (e.g., 17 hexadecimal shown in record 462 in table 460 of FIG. 11). The seventh encoded overvoltage fault indicator is associated with the fourth battery cell 94.

At step 842, the seventh application 507 sets the seventh encoded overvoltage fault indicator equal to the seventh fault value (e.g., 71 hexadecimal shown in record 462 in table 460 of FIG. 11) if the seventh overvoltage fault bit of the first memory buffer 306 is equal to the first binary value.

At step 844, the seventh application 507 sends the seventh encoded overvoltage fault indicator to the eighth application 508.

At step 846, the seventh application 507 receives the eighth encoded overvoltage fault indicator from the eighth application 508. The eighth encoded overvoltage fault indicator is associated with the fourth battery cell 94.

At step 848, the seventh application 507 commands the digital input-output device 302 to generate control signals to transition the contactor 40 to the open operational state if either the seventh encoded overvoltage fault indicator is equal to the seventh fault value or the eighth encoded overvoltage fault indicator is equal to the eighth fault value (e.g., E4 hexadecimal shown in record 472 in table 470 of FIG. 12).

Referring to FIGS. 1, 12 and 23, the eighth application 508 will now be explained. The eighth application 508 reads the table 470 to access the values therein.

At step 860, the eighth application 508 initializes an eighth encoded overvoltage fault indicator to an eighth non-fault value (e.g., 4E hexadecimal shown in record 472 in table 470 of FIG. 12). The eighth encoded overvoltage fault indicator is associated with the fourth battery cell 94.

At step 862, the eighth application 508 sets the eighth encoded overvoltage fault indicator equal to the eighth fault value (e.g., E4 hexadecimal shown in record 472 in table 470 of FIG. 12) if the eighth overvoltage fault bit of the second memory buffer 308 is equal to the first binary value.

At step 864, the eighth application 508 sends the eighth encoded overvoltage fault indicator to the seventh application 507.

At step 866, the eighth application 508 receives the seventh encoded overvoltage fault indicator from the seventh application 507. The seventh encoded overvoltage fault indicator is associated with the fourth battery cell 94.

At step 868, the eighth application 508 commands the digital input-output device 302 to generate control signals to transition the contactor 40 to the open operational state if either the seventh encoded overvoltage fault indicator is equal to the seventh fault value (e.g., 71 hexadecimal shown in record 462 in table 460 of FIG. 11) or the eighth encoded overvoltage fault indicator is equal to the eighth fault value.

The battery cell management system described herein provides a substantial advantage over other battery cell management systems. In particular, the battery cell management system described herein has a technical effect of redundantly determining whether a battery cell has an overvoltage condition utilizing first and second encoded overvoltage fault indicators, and to redundantly take safe action if either of the first and second encoded overvoltage fault indicators indicate an overvoltage condition is detected in the battery cell.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery cell management system, comprising:
    a microcontroller having a microprocessor and first and second memory buffers, the microprocessor having first and second applications;
    the first memory buffer having a first overvoltage fault bit associated with a first battery cell;
    the second memory buffer having a second overvoltage fault bit associated with the first battery cell;
    the first application setting a first encoded overvoltage fault indicator equal to a first fault value if the first overvoltage fault bit of the first memory buffer is equal to a first binary value;
    the second application setting a second encoded overvoltage fault indicator equal to the second fault value if the second overvoltage fault bit of the second memory buffer is equal to the first binary value;
    the first application receiving the second encoded overvoltage fault indicator associated with the second overvoltage fault bit from the second application;
    the second application receiving the first encoded overvoltage fault indicator from the first application;
    the first application commanding a digital input-output device to generate control signals to transition a contactor to an open operational state if either the first encoded overvoltage fault indicator is equal to the first fault value or the second encoded overvoltage fault indicator is equal to a second fault value, the first fault value having a Hamming distance of at least four from the second fault value; and
    the second application commanding the digital input-output device to generate control signals to transition the contactor to the open operational state if either the first encoded overvoltage fault indicator is equal to the first fault value or the second encoded overvoltage fault indicator is equal to the second fault value.

2. The battery cell management system of claim 1, further comprising:
    a battery cell voltage measurement IC determining whether a voltage being output by the first battery cell is greater than a threshold voltage indicating an overvoltage condition;
    the battery cell voltage measurement IC setting the first overvoltage fault bit equal to the first binary value if the voltage being output by the first battery cell is greater than the threshold voltage; and
    the battery cell voltage measurement IC sending a message having the first overvoltage fault bit to the microcontroller.

3. The battery cell management system of claim 2, wherein:
    the microcontroller copying the first overvoltage fault bit from the message to the first memory buffer; and
    the microcontroller copying the first overvoltage fault bit from the message to the second memory buffer.

4. The battery cell management system of claim 1, wherein:
    the microcontroller having third and fourth applications;
    the first memory buffer having a third overvoltage fault bit associated with a second battery cell;
    the second memory buffer having a fourth overvoltage fault bit associated with the second battery cell;
    the third application setting a third encoded overvoltage fault indicator equal to a third fault value if the third overvoltage fault bit of the first memory buffer is equal to the first binary value;

the third application receiving a fourth encoded overvoltage fault indicator associated with the fourth overvoltage fault bit from the fourth application; and the third application commanding the digital input-output device to generate control signals to transition the contactor to the open operational state if either the third encoded overvoltage fault indicator is equal to the third fault value or the fourth encoded overvoltage fault indicator is equal to a fourth fault value, the third fault value having a Hamming distance of at least four from the fourth fault value.

5. The battery cell management system of claim 4, wherein:

the fourth application setting the fourth encoded overvoltage fault indicator equal to the fourth fault value if the fourth overvoltage fault bit of the second memory buffer is equal to the first binary value;

the fourth application receiving the third encoded overvoltage fault indicator from the third application; and the fourth application commanding the digital input-output device to generate control signals to transition the contactor to the open operational state if either the third encoded overvoltage fault indicator is equal to the third fault value or the fourth encoded overvoltage fault indicator is equal to the fourth fault value.

* * * * *